(12) United States Patent
Olson

(10) Patent No.: US 8,330,504 B2
(45) Date of Patent: Dec. 11, 2012

(54) DYNAMIC BIASING SYSTEMS AND METHODS

(75) Inventor: Chris Olson, Chicago, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 114 days.

(21) Appl. No.: 13/021,411

(22) Filed: Feb. 4, 2011

(65) Prior Publication Data

US 2012/0200338 A1 Aug. 9, 2012

(51) Int. Cl.
*H03B 1/00* (2006.01)

(52) U.S. Cl. ............... 327/108; 327/530; 326/82

(58) Field of Classification Search .......... 327/108–112, 327/530, 538, 540–541, 543; 326/81–87; 330/251–253, 259–261
See application file for complete search history.

(56) References Cited

U.S. PATENT DOCUMENTS 5,229,721 A * 7/1993 Stade .................. 330/265
7,285,992 B1 * 10/2007 Maida ................. 327/112

* cited by examiner

*Primary Examiner* — An Luu
(74) *Attorney, Agent, or Firm* — Jaquez & Associates; Martin J. Jaquez, Esq.; Alessandro Steinfl, Esq.

(57) ABSTRACT

Dynamic biasing methods and circuits are described. The described methods generate bias voltages that are continuously varied so as to control stress voltages across transistors used within a cascode stack.

20 Claims, 5 Drawing Sheets

DYNAMIC BIASING SYSTEMS AND METHODS

BACKGROUND

1. Field

The present teachings relate to dynamic systems and methods. In particular, the present teachings relate to dynamically biasing one or more field-effect transistors in order to control the drain-source voltages of each of the one or more field-effect transistors.

2. Description of Related Art

In low voltage (<4 volt) semiconductor technology such as silicon on insulator (SOI), typical transistors can only withstand a limited voltage across the drain-source terminals before experiencing reliability issues. A typical maximum voltage is around 4 volts for an SOI technology with a minimum feature size of 0.5 um for the gate electrode and decreases as the minimum feature size is decreased. This limitation poses a challenge when designing circuitry such as a DC-DC converter operating at a higher power supply voltage and producing an output signal that has a voltage swing matching the higher power supply voltage. The challenge lies in ensuring that each of the transistors in an output stage of the DC-DC converter are not overloaded beyond their operating limits. Such a situation may be encountered when a chain of transistors is powered by a high power supply voltage source and the voltage drops across each of the transistors turns out to be unequal, thereby leading to undesirable stress on one or more of these transistors. Various solutions have been provided to address this issue. In one prior art solution, a hard DC bias is used to place each of the transistors in a steady-state conduction state that is aimed at ensuring relatively equal voltage drops amongst the transistors.

FIG. 1 shows a prior art circuit 100 that incorporates such a hard DC bias arrangement applied to a cascode stack. The cascode stack is composed of PMOS transistors 125, 130 and 135 that form an upper leg 126; and NMOS transistors 145, 150 and 140 that form a lower leg 146. The upper and lower legs are connected to each other at a junction node 161 wherein a time-varying signal is generated when the cascode stack is in operation. The time-varying signal is propagated through a low pass filter composed of inductor 155 and capacitor 160 in order to create a DC output voltage at output node 162. A description directed at the upper leg 126 of the cascode stack will now be provided, and it can be understood that this description is equally pertinent to the lower leg 146 as well.

Transistor 125 is configured as a switching transistor with a suitable drive signal applied to a gate terminal of the transistor. The supply voltage V+ that is applied to upper leg 126 is significantly higher than the maximum allowable source-drain voltage ($V_{DS}$) of transistor 125. Consequently, in order to maintain the $V_{DS}$ of transistor 125 at a safe operating voltage level, two additional transistors 130 and 135 are connected in series with transistor 125. The combination of the three transistors 125, 130 and 135 provide three $V_{DS}$ drops in upper leg 126, thereby ensuring that the $V_{DS}$ drop in transistor 125 does not exceed the maximum $V_{DS}$ of the device.

The $V_{DS}$ drops across each of transistors 130 and 135 is set to be relatively equal by providing a steady-state DC bias that is applied to each of the gate terminals of the two transistors. This steady-state DC bias is provided by fixed bias circuits 105 and 106 that output DC gate biasing voltages that place each of transistors 130 and 135 in conducting states with somewhat similar $V_{DS}$ drops. However, this biasing arrangement does not accommodate for variations in transistor geometries whereby the operating characteristics of transistors 130 and 135 are different thereby leading to unequal $V_{DS}$ drops in the two devices.

It is accordingly desirable to provide a biasing arrangement that ensures an even distribution of $V_{DS}$ voltage drops in the transistors of a cascode stack while preventing Vds electrical over-stress.

SUMMARY

According to a first aspect of the present disclosure, a dynamic biasing method is provided that comprises the steps of: capacitively coupling to a gate terminal of a first field-effect transistor, a first waveform that is generated at a drain terminal of the first field-effect transistor; deriving a first feedback signal from the capacitively coupled waveform present at the gate terminal of the first field-effect transistor; repetitively sampling the first feedback signal and generating therefrom, a first time-varying gate bias signal; and combining the first time-varying gate bias signal with a first steady-state DC bias voltage to generate a first dynamic gate biasing signal that operates upon the first field-effect transistor for setting a first source-drain voltage in the first field-effect transistor.

According to a second aspect of the disclosure, a bias circuit is provided, the bias circuit comprising: a coupling capacitor located between a drain terminal and a gate terminal of a first field effect transistor for coupling to the gate terminal, a first waveform that is generated at the drain terminal of the first field-effect transistor; a first resistor network configured for generating a first feedback signal from the capacitively coupled waveform present at the gate terminal of the first field-effect transistor; a sampling circuit for repetitively sampling the first feedback signal and generating therefrom, a first time-varying gate bias signal; a second resistor network configured for generating a first steady-state DC bias voltage; and an operational amplifier circuit configured for combining the first time-varying gate bias signal with the first steady-state DC bias voltage to generate a first dynamic gate biasing signal that operates upon the first field-effect transistor for setting a first source-drain voltage in the first field-effect transistor.

Further aspects of the disclosure are shown in the specification, drawings and claims of the present application.

BRIEF DESCRIPTION OF THE DRAWINGS

Many aspects of the present disclosure can be better understood with reference to the following drawings. The components in the drawings are not necessarily drawn to scale. Instead, emphasis is placed upon clearly illustrating various principles. Moreover, in the drawings, like reference numerals designate corresponding parts throughout the several views.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein. For example, it will be understood that terminology such as, for example, field-effect transistors, nodes, terminals, voltage drops, circuits, applied to, connections, and coupling are used herein as a matter of convenience for description purposes and should not be interpreted literally in a narrowing sense. For example, a node may be alternatively referred to as a terminal in this disclosure. A person of ordinary skill in the art will understand that these two terms are similar and must be interpreted accordingly. It will be also be understood that the drawings use certain symbols and interconnections that must be interpreted broadly as can be normally understood by persons of ordinary skill in the art. As one example, of such interpretation, the supply voltages shown in the figures indicate P-type devices and N-type devices that are coupled to a positive supply voltage and a ground terminal. A person of ordinary skill in the art will recognize that the P-type and N-type devices can be based on different technologies and types. The devices can be interconnected in various different ways, and the polarities, as well as connectivity, of the power supply voltages can be suitably tailored to these various circuit configurations without detracting from the spirit of the disclosure.

In particular, dynamic biasing systems and methods for use in a cascode stack are described herein. As can be understood by one of ordinary skill in the art, the described cascode stack can be incorporated into a wide variety of devices such as a DC-to-DC converter, a power amplifier, or an operational amplifier, for example. The transistors of the cascode stack can be fabricated in a low voltage technology and can safely operate from a high voltage supply that is significantly larger than the maximum voltage allowed across a single device for the given technology.

Figure 1:
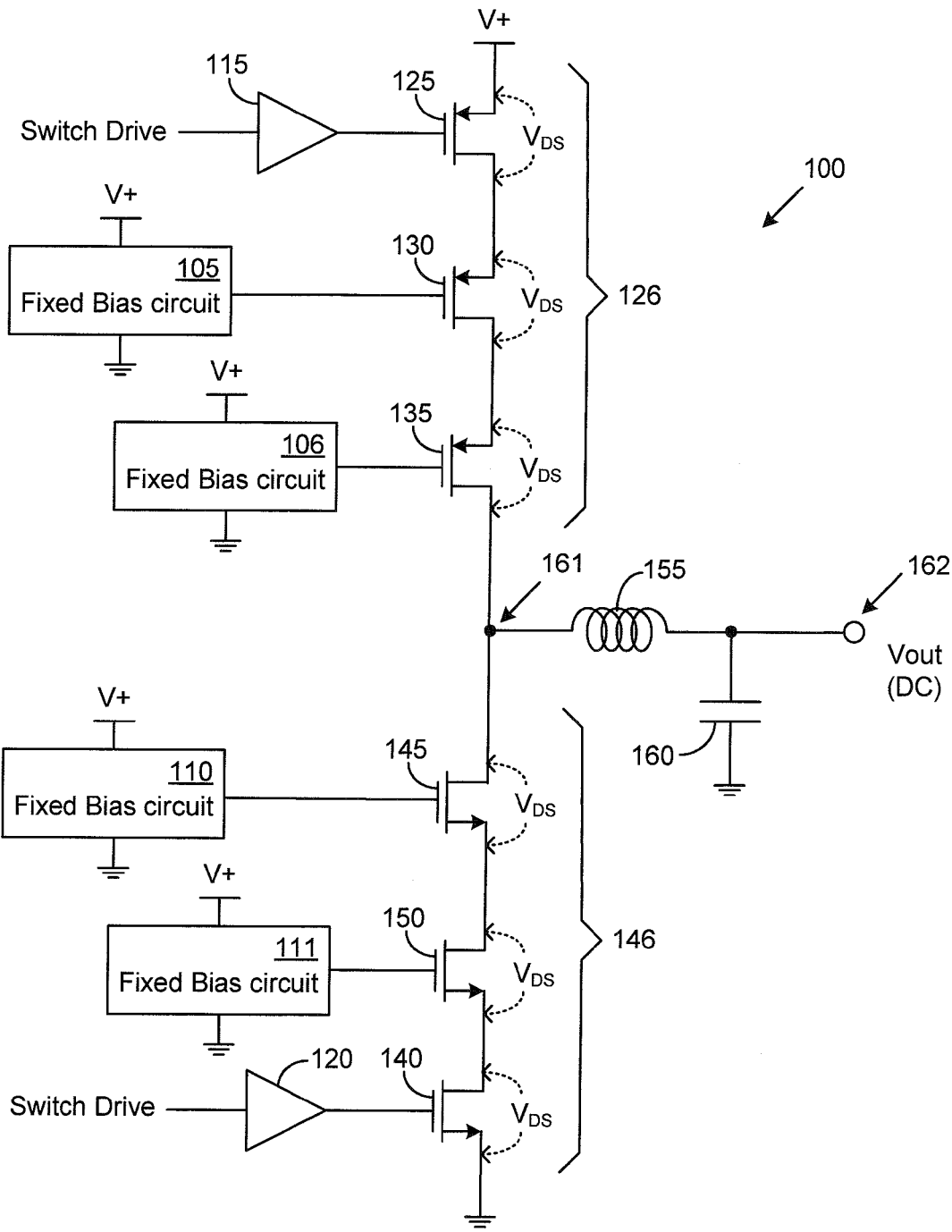
FIG. 1 shows a prior art cascode stack incorporating a fixed DC bias arrangement.
Figure 2:
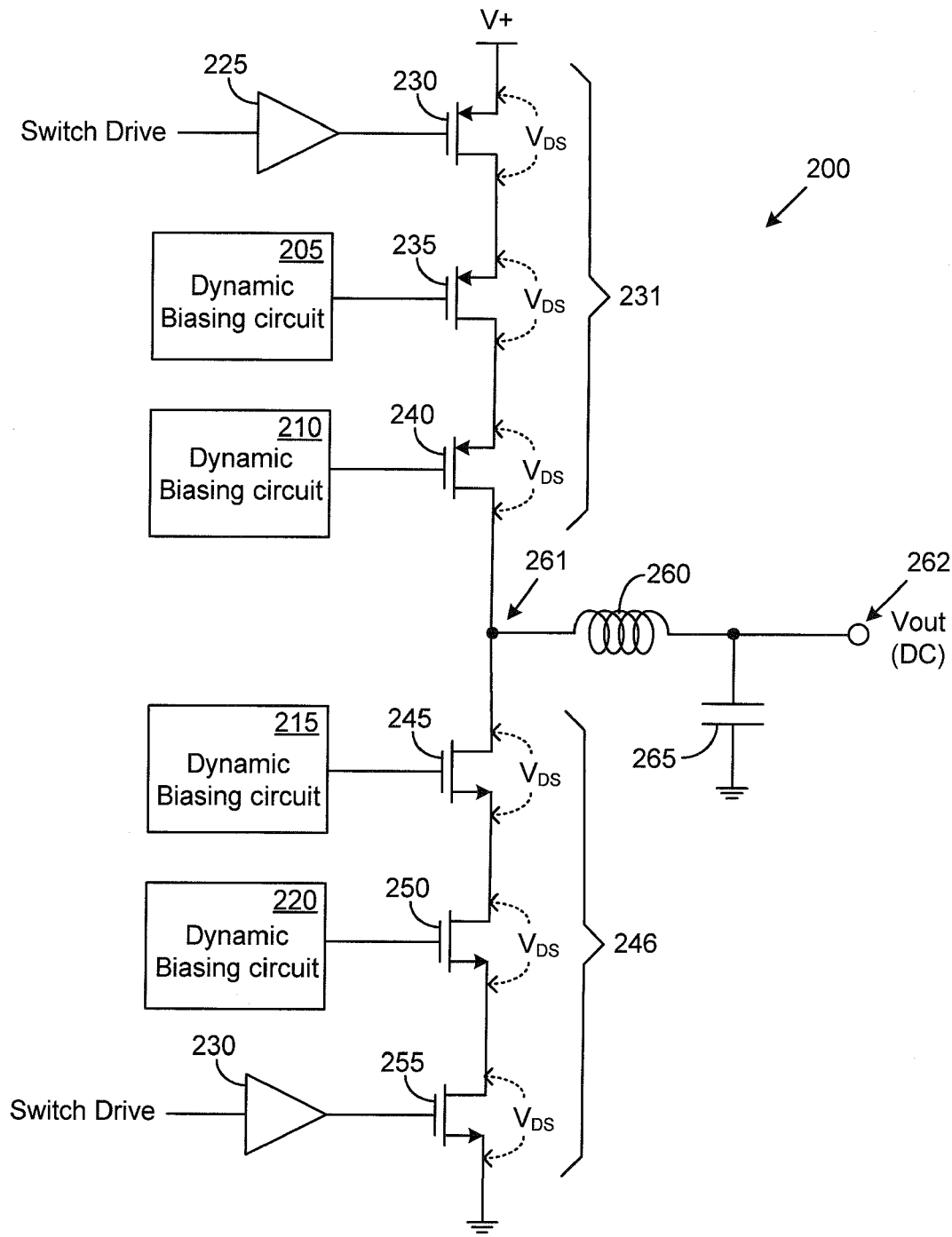
FIG. 2 shows a cascode stack incorporating a dynamic biasing arrangement in accordance with the teachings of the present disclosure.

FIG. 2 shows a circuit 200 in accordance with one embodiment of the present disclosure. Circuit 200 includes a cascode stack having an upper leg 231 and a lower leg 246. The upper and lower legs are connected to each other at a junction node 261. Each leg contains "n" number of devices where "n" is selected based on the supply voltage applied to the cascode stack. For example, if the desired $V_{DS}$ drop in each of the devices is around 4 volts and the supply voltage is +12V with reference to ground, three such devices can be connected in series so as to evenly distribute the 12V potential across the three devices in each leg. In the example circuit 200, upper leg 231 contains three P-type field effect transistors (pFETs) 230, 235 and 240; while lower leg 246 contains three N-type field effect transistors (nFETs) 245, 250 and 255. In other applications, the number "n" of transistors placed in each leg can be varied depending on the characteristics of the power supply voltage.

In operation, upper leg 231 is first placed in a conducting state, while lower leg 246 is placed in a non-conducting state. This first operation is carried out by providing a switch drive signal to pFET 230 via driver 225, and by placing pFETS 235 and 240 in a dynamically-controlled conducting state via dynamic biasing circuits 205 and 210 that are described below in more detail using FIG. 3. At the same time, nFETs 245, 250 and 255 are placed in a non-conducting state. As a result of this first operation, junction 261 is at a V+ voltage level (minus the substantially negligible voltage drops across each of the pFETs 230, 235 and 240 in the conducting state).

At a subsequent period of time, upper leg 231 is placed in a non-conducting state while lower leg 246 is placed in a conducting state. This second operation is carried out by providing a switch drive signal to nFET 255 via driver 230, and by placing nFETS 245 and 250 in a dynamically-controlled conducting state via dynamic biasing circuits 215 and 220. At this time, pFETs 230, 235 and 240 are placed in a non-conducting state that substantially constitutes an open circuit in upper leg 231. As a result of this second operation, junction 261 is placed at a ground level potential, (the voltage drops across each of the nFETs 245, 250 and 255 in the conducting state are substantially negligible).

The upper and lower legs are then cycled through the two operations described above, thus resulting in a pulse signal (AC signal) appearing at junction node 261. This pulse signal may be propagated through a low pass filter composed of inductor 260 and capacitor 265 in order to create a DC output voltage at output node 262. The low pass filter may be used when the cascode circuit is a part of a DC-to-DC converter. In other applications, the low pass filter may be omitted if an AC signal output is desired.

Figure 3:
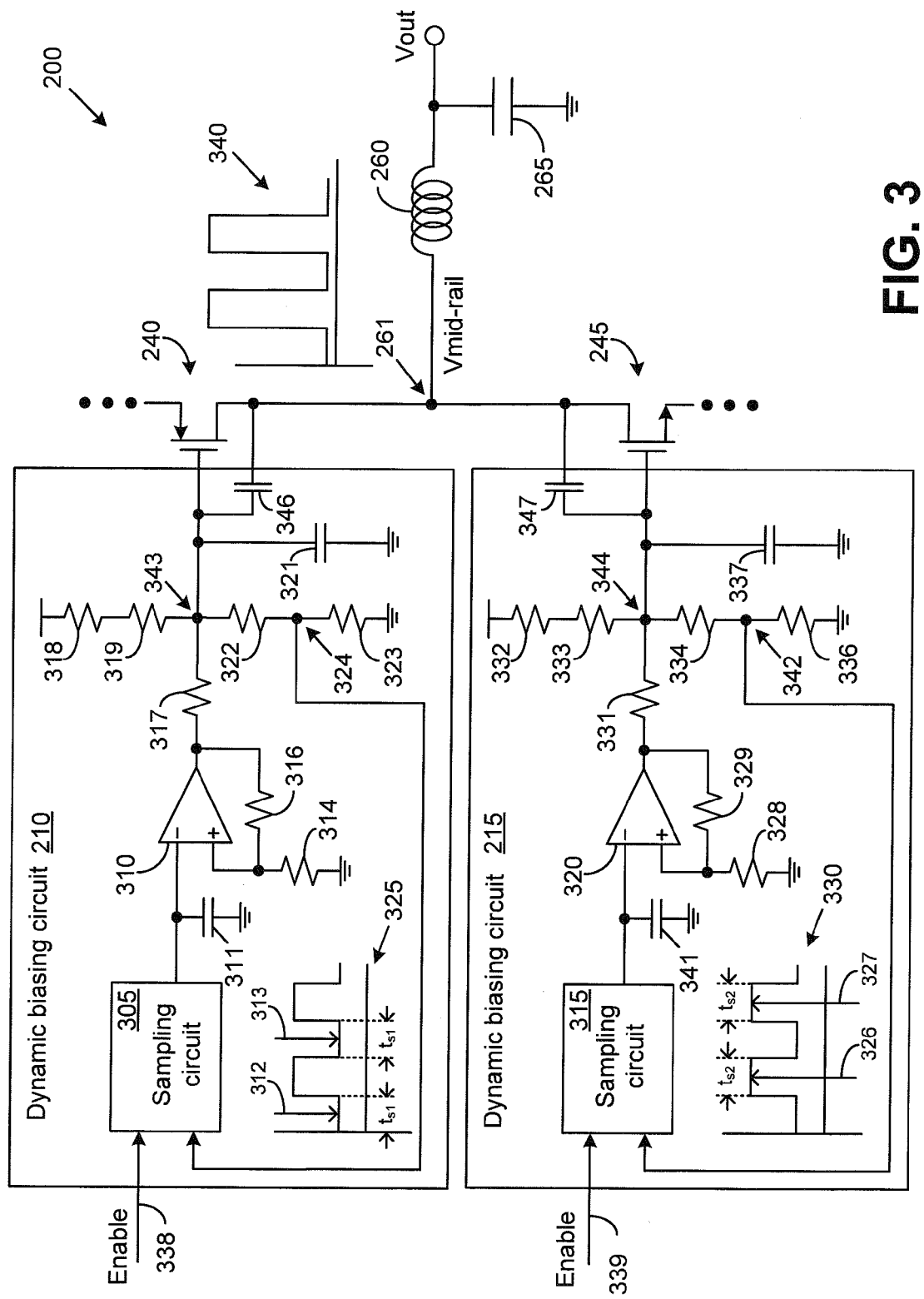
FIG. 3 shows a dynamic biasing circuit that is a part of the dynamic biasing arrangement of FIG. 2.

Attention is now drawn to FIG. 3 which shows a circuit 200 that includes a cascode stack and two dynamic biasing circuits 210 and 215 that are used to provide the dynamically-controlled conducting states mentioned above. For purposes of convenience, only two biasing circuits 210 and 215 (associated with pFET 240 and nFET 245 respectively) are shown in FIG. 3, and these two circuits are described herein. However, persons of ordinary skill in the art will understand that the description is equally applicable to dynamic biasing circuits 205 and 220 that are shown in FIG. 2.

Dynamic biasing circuit 210 provides a combination of a DC bias voltage and a time-varying biasing signal. This combination is applied to a gate terminal of pFET 240. The DC bias voltage is provided by a resistor divider network formed of resistors 318, 319, 322 and 324. Resistors 318 and 319 form an upper leg of the resistor divider network, while resistors 322 and 324 form a lower leg. A first junction node 343 is located at a junction of resistors 319 and 322, while a second junction node 324 is located at a junction of resistors 322 and 323. As can be understood by persons of ordinary skill in the art, resistors 318 and 319 can be combined into a single resistor. However, in certain applications, such as when circuit 200 is implemented inside an integrated circuit, these two resistors can be defined as two discrete elements that are formed from the same material (a doped polysilicon film material, for example), and replicate the same configuration as the two other resistors 322 and 324.

The resistor divider network that is formed of resistors 318, 319, 322 and 323 operates in conjunction with a bypass capacitor 321 to provide voltage filtering to the gate terminal of pFET 240. In one embodiment, bypass capacitor 321 and/or the resistor divider network are selected to be discrete elements. In another embodiment, bypass capacitor 321 and/or the resistor divider network are integrated elements located, for example, on a substrate inside an integrated circuit. Such integrated elements have deterministic values that can be estimated, measured, or calculated based on the nature of the materials contained in the integrated circuit. In any case, the combination of the resistor divider network and the bypass capacitor 321 provides a first time constant that is selected so as to provide a steady state bias to the gate terminal of pFET 240.

Subsequently, the steady state bias voltage is modified by a time-varying biasing signal in order to dynamically bias pFET 240 to have a $V_{DS}$ voltage drop that is substantially equal to a $V_{DS}$ voltage drop in pFET 235 (shown in FIG. 2), when each of pFETs 240 and 235 is in an off condition. The off condition typically corresponds to a non-conducting switching state. As can be understood by persons of ordinary skill in the art, the voltage drop across the drain-source terminals of a FET is substantially equal to zero when the FET is in an on condition, or in other words, in a conducting switching state.

The modification of the DC bias voltage by the time-varying biasing signal will now be explained in further detail. Sampling circuit 305 operates to generate a sampled output signal that is suitably amplified by an operational amplifier 310 for generating the time-varying biasing signal at node 343. Two input signals are provided to sampling circuit 305. The first input signal, which is generated in a control circuit (not shown) is an enable signal that is fed into sampling circuit 305 via an input line 338. The enable signal is a periodically varying binary control signal that has a repetition rate based on the switching rate of the cascode circuit. The second input signal is a feedback signal 325 that is derived from node 324 of the resistor divider network. The feedback signal 325 is a reduced-amplitude replica of a signal that is present at node 343 as a result of a capacitive coupling of an output signal from the drain terminal of pFET 240 to the gate terminal of pFET 240. In the case of pFET 240, the signal present at the drain terminal is the output signal 340 of cascode circuit 200. The drain-gate capacitive coupling is indicated in FIG. 3 by capacitor 346 that may be, in one embodiment, the intrinsic gate-drain capacitance of pFET 240. Capacitor 346 and bypass capacitor 321 operate as a capacitive divider circuit for providing a divided output signal 340 at the gate terminal of pFET 240. Sampling circuit 305 uses a repetitive sampling sequence derived from the enable signal provided on line 338, to repetitively sample the feedback signal 325 at certain instants. This sampling sequence is illustrated in the feedback signal 325. The sampling sequence repetitively samples the feedback signal 325 at a repetitive rate corresponding to sampling instances 312 and 313. The output of sampling circuit 305 is provided to operational amplifier 310, which actively drives the DC bias voltage at node 343 to a suitable offset such that the low level of output signal 340 is optimal, which in turn sets the $V_{DS}$ voltage drop in pFET 240 at a level that is substantially equal to a $V_{DS}$ voltage drop in pFET 235 (FIG. 2). The nature of sampling circuit 305 will be explained below in more detail using FIG. 4.

The operation of dynamic biasing circuit 215 is similar to that of dynamic biasing circuit 210 in several respects, such as with respect to the bypass capacitor 337, the operational amplifier 320, and the resistor divider network that is formed of resistors 332, 333, 334 and 336. However, in contrast to sampling circuit 305 contained in dynamic biasing circuit 210, sampling circuit 315 incorporates a different timing structure. In this case, sampling circuit 315 uses a repetitive sampling sequence derived from the enable signal provided on line 339 to repetitively sample feedback signal 330 at certain instants. However, the timing characteristics of the enable signal on line 339 is different than that of the enable signal present on line 338. As a result, the sampling sequence repetitively samples the feedback signal 330, at sampling instances 326 and 327 that are different than sampling instances 312 and 313 associated with feedback signal 325. Sampling instances 326 and 327 are selected to correspond to any suitable instances during the high voltage levels designated by time periods labeled $t_{S2}$ (in contrast to the low voltage levels designated by time periods labeled $t_{S1}$ in feedback signal 325).

In one embodiment, the timing characteristics of the enable signal on line 339 is offset in phase by half a cycle with respect to the enable signal present on line 338. In this example embodiment, both the enable signals have identical repetition rates, and the half cycle offset refers to this identical repetition rate. In other embodiments, the repetition rate and/or the offset can be set to other values.

Figure 4:
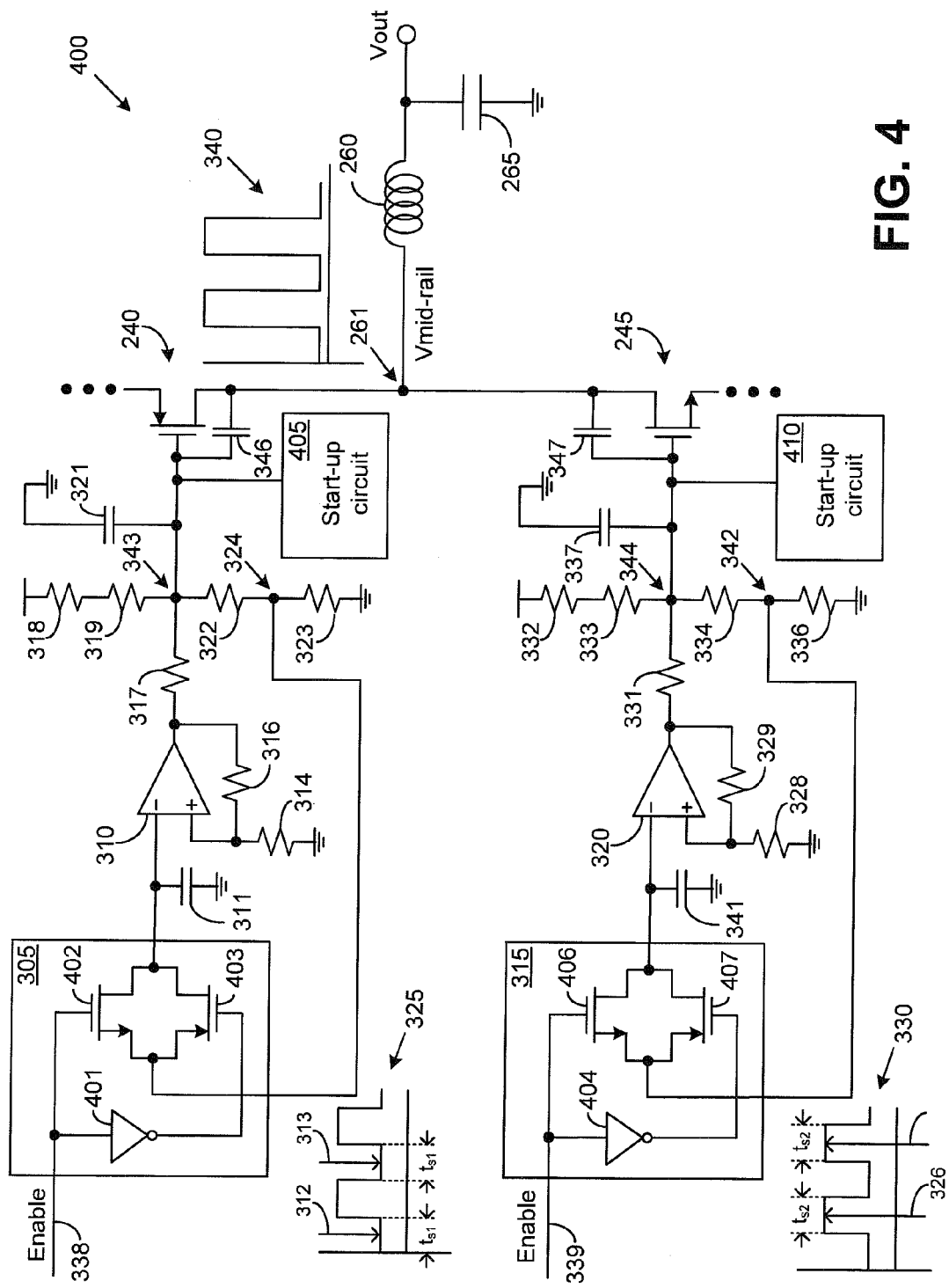
FIG. 4 shows details of a sampling circuit that is a part of the dynamic biasing arrangement of FIG. 2.

Attention is now drawn to FIG. 4 which shows certain circuit details of sampling circuits 305 and 315. Though these two circuits are shown to be identical in this example configuration, it will be understood that in other embodiments, the two circuits may not be identical and may incorporate different types of components.

As explained above, the enable signal that is fed into sampling circuit 305 via input line 338 is a periodically varying binary control signal that has a repetition rate based on the switching rate of the cascode circuit. The enable signal is generated in a control circuit (not shown) and in one embodiment, has a repetition rate matching that of the switch drive signal provided to pFET 230 via driver 225. The enable signal is connected to a gate terminal of a field-effect transistor 402, which in this example, is a pFET configured to operate as a first switching element that periodically couples the feedback signal derived from node 324 of the resistor divider network, into an input terminal of operational amplifier 310.

An inverted version of the enable signal is provided via an inverter 401 to a gate terminal of a second FET 403, which in this example is an nFET, configured to operate as a second switching element that periodically couples the feedback signal derived from node 324 of the resistor divider network, into the input terminal of operational amplifier 310. The inversion of the drive voltage provided to the gate terminal of nFET 403 with respect to that provided to the gate terminal of pFET 402 places both the FETs in an on state at substantially similar instances. These instances are selected to correspond to the low voltage levels designated by time periods labeled $t_{s1}$ in feedback signal 325.

As explained above, the output signal provided from sampling circuit 305 is coupled into operational amplifier 310 for suitable amplification before being propagated through output resistor 317 and into node 343. The DC bias voltage that is present at node 343 as a result of the resistor divider network, is modified by the time-varying biasing signal output from the operational amplifier 310, thus creating a bias voltage that dynamically varies in correspondence to the low voltage levels designated by the time periods labeled $t_{s1}$ in waveform 325. This average bias voltage is used to drive the gate terminal of pFET 240 thereby creating a $V_{DS}$ voltage drop in pFET 240 that is substantially equal to a $V_{DS}$ voltage drop in pFET 235 (shown in FIG. 2). The $V_{DS}$ voltage drops in these two pFETs are in effect only when each of pFETs 240 and 235 is in an off condition.

The operation of sampling circuit 315 is similar to that of sampling circuit 305 except for the timing characteristics vis-à-vis the enable signal provided on line 339 and the time periods labeled $t_{s2}$ in feedback signal 330.

With continued reference to FIG. 4, attention is drawn to start-up circuits 405 and 410. The operation of start-up circuit 405 will be described below in some detail, and this same description can be used to understand the operation of start-up circuit 410 as well.

As mentioned above, the combination of the bypass capacitor 321 and the resistor divider network formed of resistors 318, 319, 322 and 323 provides a first time constant that is selected so as to place a suitable passive DC bias to the gate terminal of pFET 240. In certain instances during start up when power supply V+ has a sharp ramp characteristic whose time constant is smaller than the first time constant, the various transistors of the cascode circuit may suffer unequal $V_{DS}$ voltages. Consequently, start-up circuits 405 and 410 may be incorporated in certain embodiments in order to address this issue.

Figure 5:
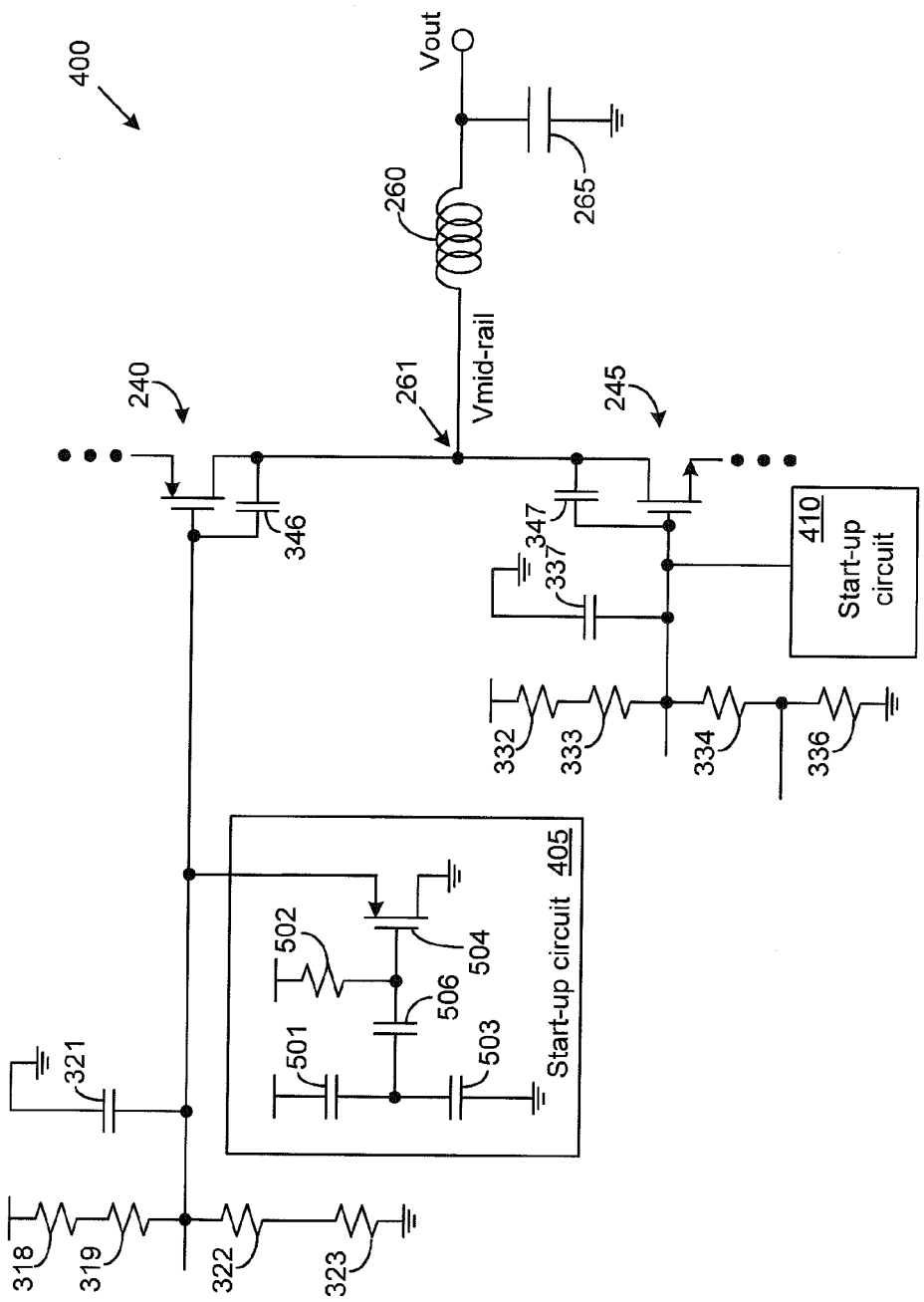
FIG. 5 shows details of a start-up circuit that is a part of the dynamic biasing arrangement of FIG. 2.

Attention is now drawn to FIG. 5, which shows a few circuit details of start-up circuit 405. In certain embodiments, the second start-up circuit 410 that is shown coupled to nFET 245 is a circuit that is exactly complementary in nature to the first start-up circuit 405 that is coupled to pFET 240. For example, pFET 504 may be replaced by an nFET and suitable bias voltages provided. However, in other embodiments, the two circuits may incorporate various other components, and may also employ different time constant values in order to address differences in the gate biasing of pFET and the nFET devices of the cascode stack.

Start-up circuit 405 incorporates resistive and capacitive components that provide a start-up time constant for operating pFET 504 such that the gate terminal of pFET 240 is temporarily held to one of a high voltage level or a low voltage level thereby overcoming an undesirable $V_{DS}$ condition in pFET 240 during start-up. This configuration involves selecting the value of the start-up time constant in start-up circuit 405 to compensate for the first time constant associated with the resistive divider network and pull-up capacitor 321. Typically, the start-up time constant is defined by the combination of resistor 502 and capacitor 506 that are each selected to have large enough values that dominantly define the start-up time constant.

As a result, when during start-up, the power supply V+ of FIG. 2 has a ramp characteristic whose time constant is larger than the first time constant, the resistor divider network solely provides the gate terminal voltage bias to pFET 240.

In contrast, when during start-up, the power supply V+ of FIG. 2 has a ramp characteristic whose time constant is comparable to the first time constant, the resistor divider network as well as start-up circuit 405 combinedly provide the gate terminal voltage bias to pFET 240.

Furthermore, when during start-up, the power supply V+ of FIG. 2 has a ramp characteristic whose time constant is smaller than the first time constant, start-up circuit 405 initially provides the gate terminal voltage bias to pFET 240. Subsequently, the resistor divider network takes over and provides the gate terminal voltage bias to pFET 240.

The operation of start-up circuit 410 can be understood by a person of ordinary skill in the art in view of the description above of start-up circuit 405.

The person skilled in the art will also appreciate that the biasing methods described herein allow a design of cascode stacks that are capable of operating with high voltage supplies while being fabricated using a technology such as silicon on insulator (SOI) which inherently allows for larger voltage handling through cascode stacks.

Accordingly, what has been shown are biasing methods and devices for cascode stacks. While the devices and methods have been described by means of specific embodiments and applications thereof, it is understood that numerous modifications and variations could be made thereto by those skilled in the art without departing from the spirit and scope of the disclosure. It is therefore to be understood that, within the scope of the claims, the disclosure may be practiced otherwise than as specifically described herein.

A number of embodiments of the present inventive concept have been described. Nevertheless, it will be understood that various modifications may be made without departing from the scope of the inventive teachings.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. A dynamic biasing method comprising:
capacitively coupling to a gate terminal of a first field-effect transistor, a first waveform that is generated at a drain terminal of the first field-effect transistor;
deriving a first feedback signal from the capacitively coupled waveform present at the gate terminal of the first field-effect transistor;
repetitively sampling the first feedback signal and generating therefrom, a first time-varying gate bias signal; and
combining the first time-varying gate bias signal with a first steady-state DC bias voltage to generate a first dynamic gate biasing signal that operates upon the first field-effect transistor for setting a first source-drain voltage in the first field-effect transistor.

2. The biasing method of claim 1, wherein the first field-effect transistor is coupled to a second field-effect transistor to form at least one of an upper or a lower leg of a cascode stack.

3. The biasing method of claim 2, further comprising:
capacitively coupling to a gate terminal of the second field-effect transistor, a second waveform that is generated at a drain terminal of the second field-effect transistor;
deriving a second feedback signal from the capacitively coupled waveform present at the gate terminal of the second field-effect transistor;
repetitively sampling the second feedback signal and generating therefrom, a second time-varying gate bias signal; and
combining the second time-varying gate bias signal with a second steady-state DC bias voltage to generate a second dynamic gate biasing signal that operates upon the second field-effect transistor for setting a second source-drain voltage in the second field-effect transistor.

4. The biasing method of claim 3, wherein the second source-drain voltage is set substantially equal to the first source-drain voltage.

5. The biasing method of claim 3, wherein the amplitudes of each of the first and the second source-drain voltages is determined at least in part by at least one of: a) the number of field-effect transistors present in the at least one of the upper or the lower leg of the cascode stack, or b) a power supply voltage applied to the at least one of the upper or the lower leg of the cascode stack.

6. The biasing method of claim 2, further comprising:
using a first switch-control signal to control a third field-effect transistor that is configured to operate as a first switching element coupled in series with the first and the second field-effect transistors located in the at least one of the upper or the lower leg of the cascode stack.

7. The biasing method of claim 3, wherein the first field-effect transistor is further coupled to a third field-effect transistor, thereby forming a junction node wherein an output signal of the cascode stack is generated.

8. The biasing method of claim 7, wherein each of the first and the second field-effect transistor is a P-channel field-effect transistor and the third field-effect transistor is an N-channel field-effect transistor.

9. The biasing method of claim 8, further comprising:
capacitively coupling to a gate terminal of the third field-effect transistor, a third waveform that is generated at a drain terminal of the third field-effect transistor;

deriving a third feedback signal from the capacitively coupled waveform present at the gate terminal of the third field-effect transistor;

repetitively sampling the third feedback signal and generating therefrom, a third time-varying gate bias signal; and combining the third time-varying gate bias signal with a third steady-state DC bias voltage to generate a third dynamic gate biasing signal that operates upon the third field-effect transistor for setting a first source-drain voltage in the third field-effect transistor.

10. The biasing method of claim 9, wherein each of the first and the third waveforms is the same as the output signal of the cascode stack, due to the coupling of the first field-effect transistor to the third field-effect transistor.

11. The biasing method of claim 3, wherein the first feedback signal is a first binary signal and generating the first time-varying gate bias signal comprises repetitively sampling the low amplitude levels of the first binary signal.

12. The biasing method of claim 11, wherein the second feedback signal is a second binary signal and generating the second time-varying gate bias signal comprises repetitively sampling the high amplitude levels of the second binary signal.

13. A dynamic bias circuit comprising:

a coupling capacitor located between a drain terminal and a gate terminal of a first field effect transistor for coupling to the gate terminal, a first waveform that is generated at the drain terminal of the first field-effect transistor;

a first resistor network configured for generating a first feedback signal from the capacitively coupled waveform present at the gate terminal of the first field-effect transistor;

a sampling circuit for repetitively sampling the first feedback signal and generating therefrom, a first time-varying gate bias signal;

a second resistor network configured for generating a first steady-state DC bias voltage; and an operational amplifier circuit configured for combining the first time-varying gate bias signal with the first steady-state DC bias voltage to generate a first dynamic gate biasing signal that operates upon the first field-effect transistor for setting a first source-drain voltage in the first field-effect transistor.

14. The bias circuit of claim 13, wherein the first field-effect transistor is coupled to a second field-effect transistor to form at least one of an upper or a lower leg of a cascode stack.

15. The bias circuit of claim 14, further comprising a bypass capacitor which operates in conjunction with the coupling capacitor to form a capacitive divider network to provide to the gate terminal of the first field effect transistor, a fractional portion of the first waveform that is generated at the drain terminal of the first field-effect transistor.

16. The bias circuit of claim 14, wherein the first resistor network comprises a first plurality of resistors configured as a first resistive divider network, and the second resistor network comprises a second plurality of resistors configured as a second resistive divider network.

17. The bias circuit of claim 16, wherein the first resistive divider network is a part of the second resistive divider network.

18. The bias circuit of claim 14, wherein each of the first and the second field-effect transistors is part of an upper leg of the cascode stack, and wherein a third field-effect transistor is configured as a part of a lower leg of the cascode stack.

19. The bias circuit of claim 14, wherein the feedback signal is a binary signal, and the sampling circuit repetitively samples one of the low amplitude levels or the high amplitude levels of the first binary signal.

20. The bias circuit of claim 14, further comprising a start-up circuit coupled to the gate terminal of the first field-effect transistor, the start-up circuit configured to have a first time constant that is selected based on a second time constant associated with a power supply provided to the cascode stack.

* * * * *